(12) United States Patent
Noda

(10) Patent No.: US 6,617,652 B2
(45) Date of Patent: Sep. 9, 2003

(54) HIGH BREAKDOWN VOLTAGE SEMICONDUCTOR DEVICE

(75) Inventor: Masaaki Noda, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/101,609

(22) Filed: Mar. 21, 2002

(65) Prior Publication Data

US 2002/0135019 A1 Sep. 26, 2002

(30) Foreign Application Priority Data

Mar. 22, 2001 (JP) .................................. 2001-082357

(51) Int. Cl.⁷ .................... H01L 29/94; H01L 31/062
(52) U.S. Cl. .................. 257/367; 257/488; 257/492; 257/496
(58) Field of Search ................... 257/367, 492, 257/496, 488

(56) References Cited

U.S. PATENT DOCUMENTS

| 4,290,077 | A | | 9/1981 | Ronen |
| 4,811,075 | A | | 3/1989 | Eklund |
| 5,003,372 | A | * | 3/1991 | Kim et al. .................. 257/330 |
| 6,190,948 | B1 | * | 2/2001 | Seok .......................... 438/140 |
| 6,310,374 | B1 | | 10/2001 | Satoh et al. |

FOREIGN PATENT DOCUMENTS

| EP | 0 967 600 A2 | 12/1999 |
| EP | 1 111 683 | 6/2001 |
| JP | 61-168253 | 7/1986 |
| JP | 2556175 B | 9/1996 |
| JP | 10-242454 | 9/1998 |
| JP | 2000-12854 | 1/2000 |

OTHER PUBLICATIONS

Patent Abstracts of Japan of Publication No. 04045578A, Application Publication Date: Feb. 14, 1992.

Specifications and Drawings for patent application Ser. No. 09/736,230, "High–Voltage Semiconductor Device" Inventors: Masaaki Noda et al.

* cited by examiner

Primary Examiner—David Nelms
Assistant Examiner—Tu-Tu Ho
(74) Attorney, Agent, or Firm—McDermott, Will & Emery

(57) ABSTRACT

A high breakdown voltage semiconductor device includes a semiconductor layer, a drain offset diffusion region, a source diffusion region, a drain diffusion region, a buried diffusion region of a first conductivity type that is buried in the drain offset diffusion region, at least one plate electrode in a floating state formed on a field insulating film, and a metal electrode that is formed on an interlayer insulating film positioned on the plate electrode and a part of which is electrically connected to the drain diffusion region and that is capacitively coupled to the plate electrode.

13 Claims, 15 Drawing Sheets

FIG. 15        PRIOR ART
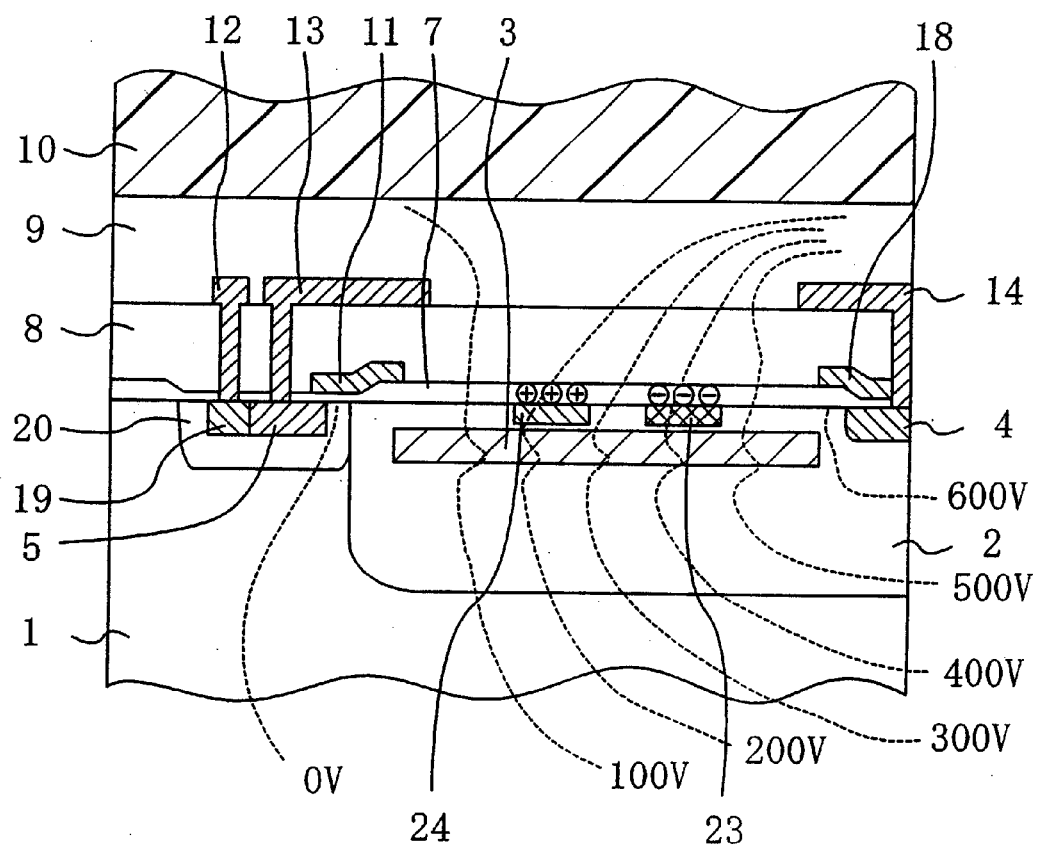

HIGH BREAKDOWN VOLTAGE SEMICONDUCTOR DEVICE

BACKGROUND OF THE INVENTION

The present invention relates to a high breakdown voltage semiconductor device.

A conventional high breakdown voltage semiconductor device is disclosed, for example, in Japanese Laid-Open Patent Publication No. 2000-12854. The high breakdown voltage semiconductor device disclosed in this publication is an insulated gate transistor. Hereinafter, a conventional insulated gate transistor will be described with reference to FIG. 12. FIG. 12 schematically shows a cross-sectional structure of a conventional insulated gate transistor.

The insulated gate transistor shown in FIG. 12 includes a p-type semiconductor substrate 1, a drain offset diffusion region 2 containing a low concentration of n-type impurities formed in the semiconductor substrate 1, a low concentration buried diffusion region 3 containing p-type impurities buried in the drain offset diffusion region 2, a drain diffusion region 4 containing a high concentration of n-type impurities located in the drain offset diffusion region 2, a source diffusion region 5 containing a high concentration of n-type impurities formed in the semiconductor substrate 1, and a diffusion region 19 for contact containing a high concentration of p-type impurities. The low concentration buried diffusion region 3 serves to promote the depletion of the drain offset diffusion region 2 when a high voltage is applied to the drain. Although not shown in FIG. 12, a part of the low concentration buried diffusion region 3 is connected to the semiconductor substrate 1. A diffusion region 20 for preventing a punch-through containing p-type impurities is formed in the semiconductor substrate 1 so as to enclose the source diffusion region 5 and the diffusion region 19 for contact. The diffusion region 20 for preventing a punch-through serves to increase the concentration of the p-type impurities between the drain offset diffusion region 2 and the source diffusion region 5, which are the active regions of an MOS transistor, to prevent a punch-through phenomenon between them.

A thin gate oxide film 6 and a thick oxide film (field oxide film) 7 are formed on the semiconductor substrate 1. A gate electrode 11 made of polysilicon is provided on a portion of the oxide film 6 or 7 on the portion between the drain offset diffusion region 2 and the source diffusion region 5. A drain polysilicon electrode 18 is formed on a portion of the oxide film 6 or 7 that is positioned on a portion between the drain offset diffusion region 2 and the drain diffusion region 4. An interlayer insulating film 8 is formed so as to cover the oxide films 6 and 7, the gate electrode 11, and the drain polysilicon electrode 18.

Metal electrodes 12, 13 and 14 are connected to the diffusion region 19 for contact, the source diffusion region 5 and the drain diffusion region 4, respectively. The metal electrode 12 is a metal electrode for a body to be connected to the p-type semiconductor substrate 1, which is a body. The metal electrode 13 is a metal electrode for a source for contact with the source diffusion region 5. The metal electrode 14 is a metal electrode for a drain for contact with the drain diffusion region 4. A surface protective film 9 is formed on the metal electrodes 12, 13 and 14 and the interlayer insulating film 8. A resin for sealing 10 is formed thereon.

In the insulated gate transistor shown in FIG. 12, a GND potential is supplied to the metal electrode 13 for a source, the metal electrode 12 for a body, and the low concentration p-type buried diffusion region 3. A positive high potential is supplied to the metal electrode 14 for a drain. A control voltage is supplied to the gate electrode 11. When a positive potential (control voltage) of a threshold or more is supplied to the gate electrode 11, an inversion from the p-type to the n-type occurs in the vicinity of the surface of the semiconductor substrate 1 immediately below the gate electrode 11, and thus a so-called channel region is generated so that the insulated gate transistor becomes conductive. The conducted current in this case flows from the drain diffusion region 4 through the drain offset diffusion region 2 and the channel region on the surface of the semiconductor substrate 1 to the source diffusion region 5. On the other hand, when the voltage of less than a threshold is supplied to the gate electrode 11, the channel region becomes small, so that the insulated gate transistor becomes non-conductive.

In this specification, maintaining the non-conductive state in a transistor is defined as "having a breakdown voltage", and maintaining the non-conductive state in a transistor at a high bias voltage (e.g., 100 V or more) is defined as "having a high breakdown voltage". The resistance value between the source and the drain while a transistor is conductive is defined as "ON resistance".

Next, FIG. 13 is referred to. FIG. 13 shows the potential distribution when a high voltage (600 V) is supplied to the high breakdown voltage semiconductor device (insulated gate transistor) shown in FIG. 12 at room temperature, and an equipotential line for each potential is indicated by a broken line. This potential distribution (equipotential lines) is obtained based on the results of simulation by the inventors of the present invention.

The potential distribution shown in FIG. 13 is one obtained when 0(V) is supplied to the p-type semiconductor substrate 1, the p-type low concentration buried diffusion region 3, and the n-type source diffusion region 5; 0(V) is supplied to the gate electrode 11; and 600 (V) is supplied to the n-type drain diffusion region 4. The equipotential lines in this case are shown by broken lines.

The high breakdown voltage semiconductor device shown in FIG. 12 utilizes a technique called "resurf" for depleting the entire drain offset diffusion region 2 to ensure an initial breakdown voltage. The principle thereof will be described below.

To operate this high breakdown voltage semiconductor device, in general, 0 (V) is supplied to the semiconductor substrate 1 and the source diffusion layer region 5, and a drain voltage necessary for operation is supplied to the metal electrode 14. When the drain voltage is gradually increased from 0 (V), while the drain voltage is low, a depletion layer stemming from the pn junction between the p-type semiconductor substrate 1 and the n-type drain offset diffusion region 2 extends into the p-type semiconductor substrate 1 and the drain offset diffusion region 2, and a depletion layer stemming from the pn junction between the p-type low concentration buried diffusion region 3 and the drain offset diffusion region 2 extends into the low concentration buried diffusion region 3 and the drain offset diffusion region 2. In FIG. 13, the concentration distribution in the vertical direction of the low concentration buried diffusion region 3 is such that the concentration of the central portion is high, and the concentration is decreased as being apart from the central portion in the upward or downward direction. Therefore, the potential in the vertical direction in the low concentration buried diffusion region 3 is distributed such that the potential is kept low in the central portion.

Furthermore, 0 (V) is set in the portion on the source side in the low concentration buried diffusion region 3, and the region extends to the drain side, so that the potential in the low concentration buried diffusion region 3 in the horizontal direction is distributed such that the potential increases in the direction from the source to the drain. Therefore, as shown in FIG. 13, the equipotential lines in the low concentration buried diffusion region 3 have a projection to the drain side.

Next, as the drain voltage is increased, the depletion layer extending from the pn junction between the semiconductor substrate 1 and the drain offset diffusion region 2 is joined with the depletion layer extending from the pn junction between the low concentration buried diffusion region 3 and the drain offset diffusion region 2. When the voltage is further increased, the drain offset diffusion region 2 is depleted except the portion near the drain diffusion region 4. When the voltage is even further increased, most of the drain offset diffusion region 2 is depleted. That is to say, high breakdown voltage characteristics can be obtained by depleting the drain offset diffusion region 2 to alleviate the concentration of the electric field in the drain offset diffusion region 2. In this structure, the low concentration buried diffusion region 3 has an effect of promoting the depletion of the drain offset diffusion region 2. Therefore, comparing this case with the case where the low concentration buried diffusion region 3 is not provided, even if the drain offset diffusion region 2 has a high concentration of impurities, the drain offset diffusion region 2 can be depleted at a comparatively low drain voltage. As a result, the electric field in the drain offset diffusion region 2 is alleviated, so that high breakdown voltage characteristics can be obtained. In addition, when the same high breakdown voltage characteristics are to be maintained, comparing with the case where the low concentration buried diffusion region 3 is not provided, the concentration of impurities in the drain offset diffusion region 2 can be increased, so that the ON resistance of the insulated gate transistor can be reduced.

In the structure shown in FIG. 13, the drain offset diffusion region 2 is depleted except the portion near the drain diffusion region 4, so that the equipotential lines in the drain offset diffusion region 2 are distributed uniformly. In particular, in the vicinity of the surface, the distribution of the equipotential lines is substantially perpendicular to the horizontal direction.

Next, FIG. 14 shows a current path when the transistor is conductive. The current coming from the drain electrode 14 flows into the drain diffusion region 4, and then flows through the drain offset diffusion region 2. The current flowing through the drain offset diffusion region 2 flows along two paths, namely, the upper layer portion and the lower layer portion that are divided by the low concentration buried diffusion region 3 buried in the drain offset diffusion region 2. After the divided currents are met and merged into one, the current flows into the source diffusion region 5 through a channel region formed immediately below the gate electrode 11 on the semiconductor substrate 1. Then, the upper layer portion in the drain offset diffusion region 2 has a higher concentration of impurities and a lower specific resistance than those of the lower layer portion, so that most of the current flows in the upper layer portion. Therefore, the amount of the current flowing in the upper layer portion having a high concentration of impurities is an important factor to reduce the ON resistance (the resistance between the source and the drain when the transistor is conductive) of the insulated gate transistor.

However, for example, when the above-described conventional high breakdown voltage semiconductor device is operated at a high temperature of an ambient temperature of 150° C. while a high voltage of 500 V or more, such as 600 V, is applied to the metal electrode 14 for the drain, the ON resistance (the resistance between the source and the drain when the transistor is conductive) is increased. This phenomenon can be reproduced by performing a high temperature bias test, which is a life test, and when the voltage applied to the metal electrode 14 for the drain is increased, the change in the ON resistance becomes significant. On the other hand, when the applied voltage is dropped, the change in the On resistance becomes small.

The mechanism of the change in the ON resistance in a high temperature bias test cannot be clarified, and it only can be inferred. One of such inference is as follows.

In general, a semiconductor chip is sealed with a resin for sealing so as to prevent water content from penetrating the resin package. However, novolak epoxy resin used commonly as the resin for sealing contains 0.9% to 1.6% of hydroxyl (OH) groups, and when the hydroxyl groups are activated at a high temperature, the resin 10 for sealing, which is generally regarded as an insulator, becomes semi-insulative (conductive at a high resistance).

In the high breakdown voltage semiconductor device, in general, a semiconductor chip is molded with the resin 10 for sealing, and a plurality of external terminals (not shown) are connected to a plurality of pads (not shown) on the semiconductor chip with metal wires (not shown). To these metal wires, 0 V, which is a ground voltage, 600 V, which is a power source voltage, and a control signal are applied, and therefore when the resin 10 for sealing becomes semi-insulative for the above-described reason, it is inferred that an intermediate voltage between 600 V and 0 V is applied to the surface of the surface protective film 9. Depending on the layout of the semiconductor chip, the resin 10 for sealing positioned on the insulated gate transistor can be of an intermediate voltage of about 100 V, when for example, a pad for ground (not shown) is provided on the side of the insulated gate transistor of the semiconductor chip, and a pad for a power source (not shown) is provided in a position apart from the pad for ground. Taking this into consideration, assuming that the interface between the surface protective film 9 and the resin for sealing 10 of the semiconductor chip is of a potential of 100 V during a high temperature bias test, the inventors of the present invention examined the potential distribution that can be obtained in this case.

Hereinafter, the potential distribution in a high temperature bias test will be described with reference to FIG. 15. FIG. 15 is a view showing a conceivable potential distribution during a high temperature bias test at a high temperature under the same bias conditions as those described with reference to FIG. 14. In FIG. 15, the broken lines indicate equipotential lines.

As shown in FIG. 15, the potential at the interface between the surface protective film 9 and the resin 10 for sealing is of 100 V during the high temperature bias test, so that the equipotential lines of 100 V or less on the surface of the drain offset diffusion region 2 are inclined to the source side, and the equipotential lines of more than 100 V are inclined to the drain side. The inclination of the equipotential lines of more than 100 V to the drain side means that the potential on the oxide film 7 side is negative with respect to the surface of the n-type drain offset diffusion region 2 at the interface between the n-type drain offset diffusion region 2 and the oxide film 7.

In addition, it is reported that when the potential on the oxide film side becomes negative in a high temperature atmosphere at the interface between the semiconductor region and the oxide film, bonds such as Si—H and Si—OH at the interface are broken, and positive fixed charges are generated ("Reliable Technique of Semiconductor Device" published by Union of Japanese Scientists and Engineers). When positive fixed charges are generated at the interface between the drain offset diffusion region 2 and the oxide film 7 by such a phenomenon, negative movable charges also are generated in the oxide film 7. Then, the negative movable charges in the oxide film 7 are attracted to the positive high potential of the metal electrode 14 for a drain over time, and a large number of negative charges are distributed near the metal electrode 14 for a drain in the oxide film 7. The negative movable charges that have moved near the metal electrode 14 for a drain in the oxide film 7 are distributed at the interface between the oxide film 7 and the drain offset diffusion region 2, because the equipotential lines in the oxide film 7 are inclined to the drain side. The portion where the negative movable charges were present before the movement is turned into a region where a large number of positive fixed charges are distributed.

In other words, since a large number of negative charges are present at the interface in the oxide film 7 near the metal electrode 14 for a drain, holes in the drain offset diffusion region 2 are attracted thereto, so that the surface of the drain offset diffusion region 2 is inversed to a p-type and becomes a p-type inversion layer 23. On the other hand, in the region where the positive fixed charges remain, electrons in the drain offset diffusion region 2 are attracted thereto, so that the electron density is high locally in the drain offset diffusion region 2. As a result, an n-type accumulated layer 24 is generated in the vicinity of the surface of the drain offset diffusion region 2. Thus, the p-type inversion layer 23 and the n-type accumulated layer 24 are generated in the surface of the drain offset diffusion region 2. The p-type inversion layer 23 narrows the current path in the upper layer in the drain offset diffusion region 2. As a result, it seems that the ON resistance is increased over time.

SUMMARY OF THE INVENTION

Therefore, with the foregoing in mind, it is a main object of the present invention to provide a high breakdown voltage semiconductor device having high reliability in which the ON resistance is not deteriorated even if the semiconductor device is used at a high temperature.

A high breakdown voltage semiconductor device of the present invention includes a semiconductor layer of a first conductivity type; a drain offset diffusion region of a second conductivity type formed in the semiconductor layer of the first conductivity type; a source diffusion region of the second conductivity type formed in the semiconductor layer of the first conductivity type apart from the drain offset diffusion region; a drain diffusion region of the second conductivity type formed in the drain offset diffusion region; a buried diffusion region of the first conductivity type that is buried in the drain offset diffusion region and at least a part of which is electrically connected to the semiconductor layer of the first conductivity type; a gate insulating film formed on a portion of the semiconductor layer of the first conductivity type that is positioned between the source diffusion region and the drain offset diffusion region; a gate electrode formed on the gate insulating film; a field insulating film formed on the drain offset diffusion region; at least one plate electrode in a floating state formed on the field insulating film; an interlayer insulating film formed on the field insulating film and the at least one plate electrode; and a metal electrode that is formed on the interlayer insulating film positioned on the at least one plate electrode and a part of which is electrically connected to the drain diffusion region and that is capacitively coupled to the at least one plate electrode.

In one embodiment of the present invention, the drain diffusion region is formed in the central portion of the drain offset diffusion region, and has a substantially circular shape when viewed from the normal direction of the semiconductor layer, the source diffusion region is formed in the semiconductor layer with a predetermined distance from the outer circumference of the drain offset diffusion region so as to surround the outer circumference thereof, and the buried diffusion region is buried in the drain offset diffusion region so as to surround the substantially circular outer circumference of the drain diffusion region.

In one embodiment of the present invention, a plurality of annular electrodes that are formed concentrically around the drain diffusion region as its center are used as the at least one plate electrode.

In one embodiment of the present invention, the metal electrode comprises a plurality of annular metal electrodes positioned on the plurality of annular electrodes via the interlayer insulating film, and a joining portion electrically connecting the plurality of annular metal electrodes to each other, and each of the plurality of annular electrodes is capacitively coupled to the corresponding one of the plurality of annular metal electrodes via the interlayer insulating film.

In one embodiment of the present invention, when viewed from the normal direction of the substrate layer, the metal electrode has a portion covering the entire region up to the outer edge of the annular electrode that is positioned nearest to the drain diffusion region of the plurality of annular electrodes with the drain diffusion region as its center.

In one embodiment of the present invention, the width of the metal electrode positioned above the at least one plate electrode is smaller than that of the at least one plate electrode.

In one embodiment of the present invention, when viewed from the normal direction of the substrate layer, the metal electrode has a portion extended so as to cross a part of the at least one plate electrode on the interlayer insulating film.

In one embodiment of the present invention, the high breakdown semiconductor device further includes a surface protective film formed on the metal electrode and the interlayer insulating film, and a sealing resin portion formed on the surface protective film.

In one embodiment of the present invention, the semiconductor layer is a semiconductor substrate.

In one embodiment of the present invention, the semiconductor layer of the first conductivity type is formed on an insulating substrate.

According to the present invention, at least one plate electrode in a floating state formed on a field insulating film, and a metal electrode that is capacitively coupled to the at least one plate electrode and a part of which is electrically connected to the drain diffusion region. Therefore, positive fixed charges and negative movable charges can be suppressed from being generated at the interface between the drain offset diffusion region and the field insulating film. As a result, a highly reliable high breakdown voltage semiconductor device in which the ON resistance is not changed during a high temperature bias reliability test can be provided.

BRIEF DESCRIPTION OF THE DRAWINGS

FIG. 15 is a cross-sectional view for illustrating the breakdown voltage deterioration during a high temperature bias test of the conventional high breakdown voltage semiconductor device.

DETAILED DESCRIPTION OF THE INVENTION

Figure 1:
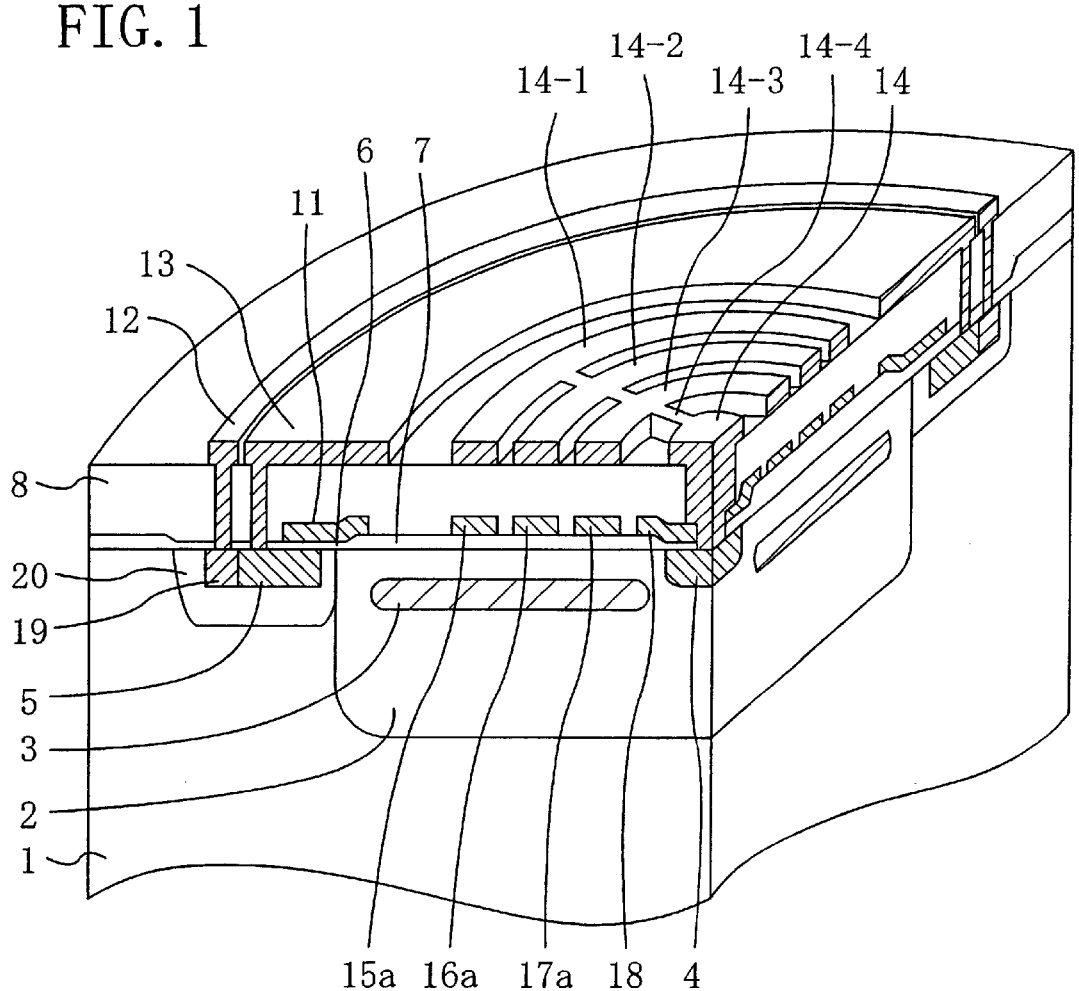
FIG. 1 is a cross-sectional perspective view of a high breakdown voltage semiconductor device of Embodiment 1 of the present invention.

Hereinafter, embodiments of the present invention will be described with reference to the accompanying drawings. For simplification of description, in the following drawings, the components having substantially the same functions bear the same reference numeral. In the following embodiments, the description is directed mainly to a high breakdown voltage semiconductor device having a breakdown voltage of 100 V or more (e.g., 500 to 800 V). It should be noted that the present invention is not limited to the following embodiments.

Embodiment 1

A high breakdown voltage semiconductor device of Embodiment 1 will be described with reference to FIGS. 1 to 4. FIG. 1 is a schematic cross-sectional perspective view showing the cross-sectional structure of the high breakdown voltage semiconductor device of this embodiment. In FIG. 1, for easy visual understanding of the structure of this embodiment, a surface protective film and a resin for sealing, which are the uppermost layers of the semiconductor chip, are omitted.

The high breakdown voltage semiconductor device (insulated gate transistor) of this embodiment includes a semiconductor layer 1 of a first conductivity type, a drain offset diffusion region 2 of a second conductivity type formed in the semiconductor layer 1, a source diffusion region 5 of the second conductivity type formed in the semiconductor layer 1 apart from the drain offset diffusion region 2, a drain diffusion region 4 of the second conductivity type formed in the drain offset diffusion region 2, and a buried diffusion region 3 of the first conductivity that is buried in the drain offset diffusion region and at least a part of which is electrically connected to the semiconductor layer 1. A gate insulating film 6 is formed on a portion positioned between the source diffusion region 5 and the drain offset diffusion region 2 of the semiconductor layer 1, and a gate electrode 11 is formed on the gate insulating film 6. A field insulating film 7 is formed on the drain offset diffusion region 2, and plate electrodes 15a, 16a, and 17a formed in the floating state are provided on the field insulating film 7. An interlayer insulating film 8 is formed on the field insulating film 7 and the plate electrodes 15a, 16a, and 17a, and metal electrodes 14 and 14-1 to 14-4 a part of which is electrically connected to the drain diffusion region 4 and that are capacitively coupled to the corresponding plate electrodes 15a, 16a, and 17a are formed on the interlayer insulating film 8 positioned on the plate electrodes 15a, 16a, and 17a.

Describing the above more specifically, the semiconductor layer 1 of this embodiment is a p-type semiconductor substrate (p-type silicon substrate), and the drain offset diffusion region 2 contains a low concentration of n-type impurities. The buried diffusion region 3 is a p-type low concentration buried diffusion region, and has a function to promote the depletion of the drain offset diffusion region 2 when a high voltage is applied to the drain. The drain diffusion region 4 contains a high concentration of n-type impurities, and the source diffusion region 5 contains a high concentration of n-type impurities. Also in the high breakdown voltage semiconductor device of this embodiment, a technique called resurf, which has been described above, is utilized.

In this embodiment, the drain diffusion region 4 is formed in the central portion of the drain offset diffusion region 2, and has a substantially circular shape when viewed from the normal direction of the semiconductor substrate 1. The source diffusion region 5 is formed in the semiconductor substrate 1 with a predetermined distance (e.g., 2.5 μm) from the outer circumference of the drain offset diffusion region 2 so as to surround the outer circumference thereof. The buried diffusion region 3 is buried in the drain offset diffusion region 2 so as to surround the substantially circular outer circumference of the drain diffusion region 4.

A diffusion region 19 for contact containing a high concentration of p-type impurities is provided in the p-type semiconductor substrate 1, and a diffusion region 20 for preventing a punch-through containing p-type impurities is formed so as to surround the diffusion region 19 for contact and the source diffusion region 5. The diffusion region 20 for punch-through prevention has a function to increase the concentration of the p-type impurities between the drain offset diffusion region 2 and the source diffusion region 5, which are active regions of a MOS transistor, to prevent the drop of the breakdown voltage due to the punch-through phenomenon between the regions 2 and 5.

Furthermore, the gate insulating film 6 of this embodiment is a thin gate oxide film, and the field insulating film 7 is a thick oxide film. In this embodiment, the gate insulating film 6 and the field insulating film 7 are continuous, and are both made of, for example, silicon oxide. The gate electrode 11 positioned on the gate insulating film 6 is made of polysilicon. A drain polysilicon element 18 is formed on a portion of the oxide film 6 or 7 that is positioned above a portion between the drain offset diffusion region 2 and the drain diffusion region 4. Although not shown in FIG. 1, a surface protective film 9 is formed on the interlayer insulating film 8 and a resin 10 for sealing is formed thereon.

A metal electrode 12 for a body to be connected to the semiconductor substrate 1, which is the body, is connected to the diffusion region 19 for contact in the semiconductor substrate 1, and a metal electrode 13 for a source for contact with the source diffusion region 5 is connected to the source diffusion region 5. In this embodiment, the metal electrodes 12 and 13 are electrically connected for use. A metal electrode 14 for a drain for contact with the drain diffusion region 4 is connected to the drain diffusion region 4. The metal electrodes 12, 13 and 14 are made of aluminum or an aluminum alloy.

The metal electrode 14 for a drain is a disk-like metal electrode (or cylindrical metal electrode) whose upper end has a disk-like planar shape. The metal electrode 14 for a drain is electrically connected to a plurality of annular metal electrodes 14-1, 14-2, and 14-3 that are annular in their planar shape, and the metal electrode 14 for a drain and the annular metal electrodes 14-1, 14-2, and 14-3 are joined by a joining portion 14-4. The annular metal electrodes 14-1, 14-2, and 14-3 are capacitively coupled to the plate electrodes 15a, 16a and 17a, respectively, which are in an electrically floating state. In this embodiment, the plate electrodes 15a, 16a and 17a are a plurality of annular electrodes formed concentrically around the drain diffusion region 4 as the center, and made of polysilicon. The plate electrodes 15a, 16a and 17a and the annular metal electrodes 14-1, 14-2, and 14-3 are concentric circles with the same center when viewed from the normal direction of the substrate.

Next, the operation of the high breakdown voltage semiconductor device of this embodiment will be described with reference to FIGS. 2 to 4.

Figure 2:
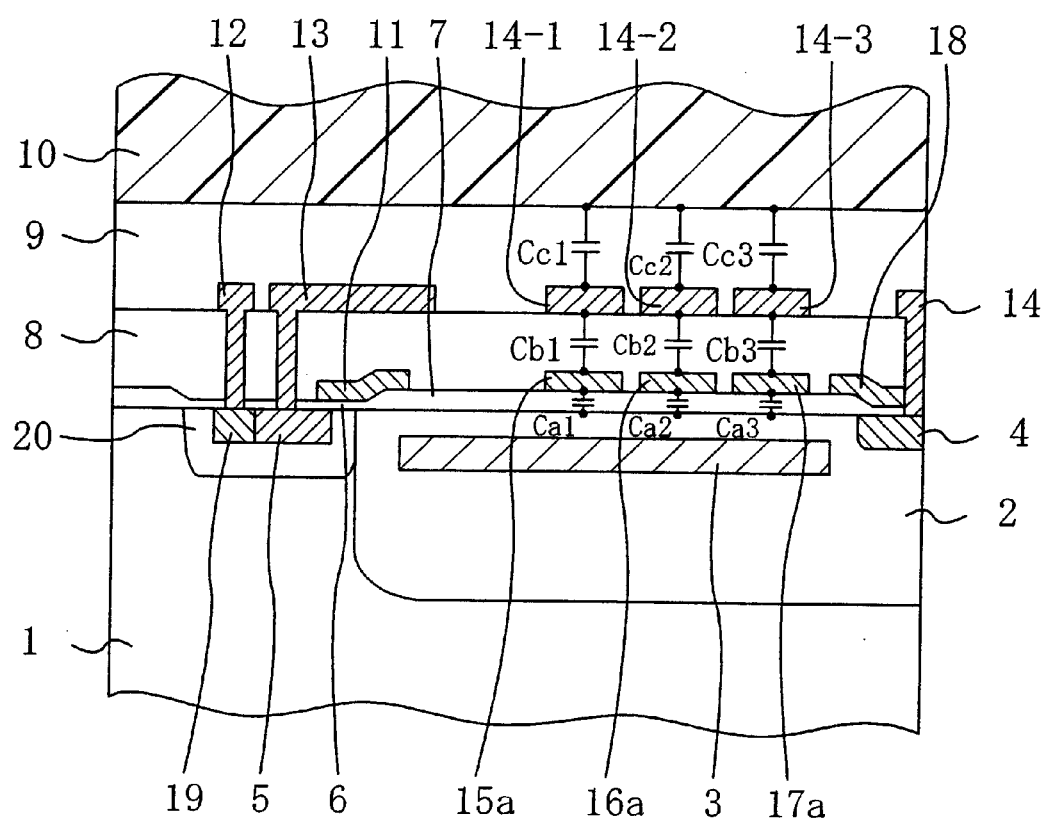
FIG. 2 is a cross-sectional view of a principal part showing a principal cross sectional structure of the high breakdown voltage semiconductor device of Embodiment 1.

FIG. 2 is a cross-sectional view of a principal part for illustrating the parasitic capacitance of the high breakdown voltage semiconductor device of this embodiment. FIG. 3 is a conceptual view showing the potential distribution at room temperature of the high breakdown voltage semiconductor device, and FIG. 4 is a conceptual view showing the potential distribution during a high temperature bias test.

Figure 3:
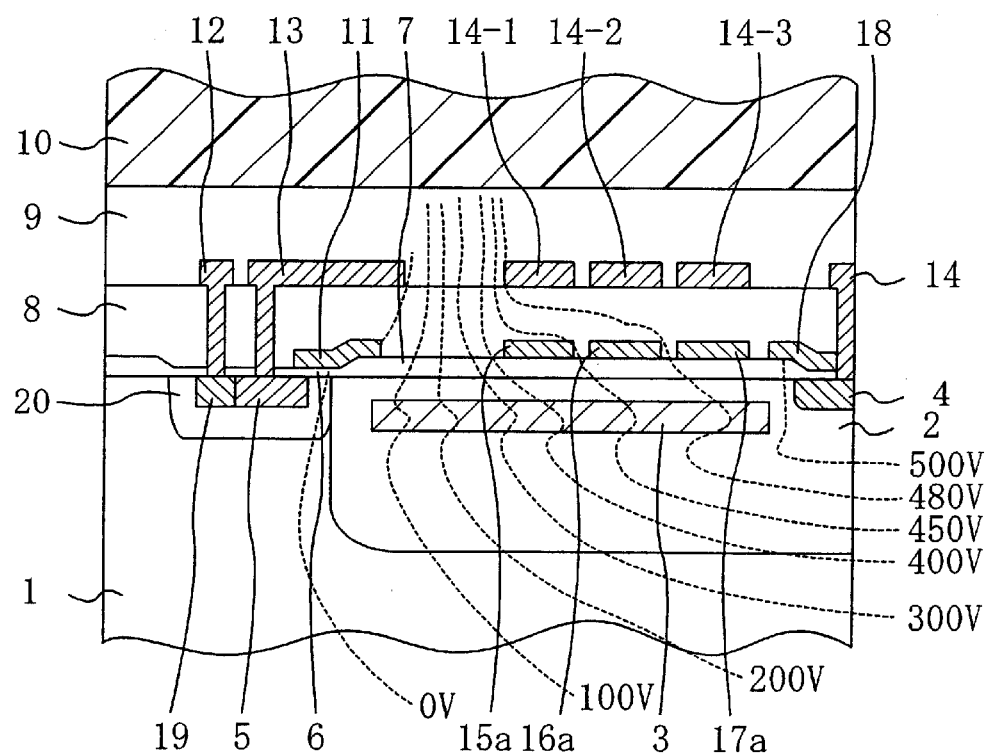
FIG. 3 is a cross-sectional view for illustrating the potential distribution at room temperature of the high breakdown voltage semiconductor device of Embodiment 1.
Figure 4:
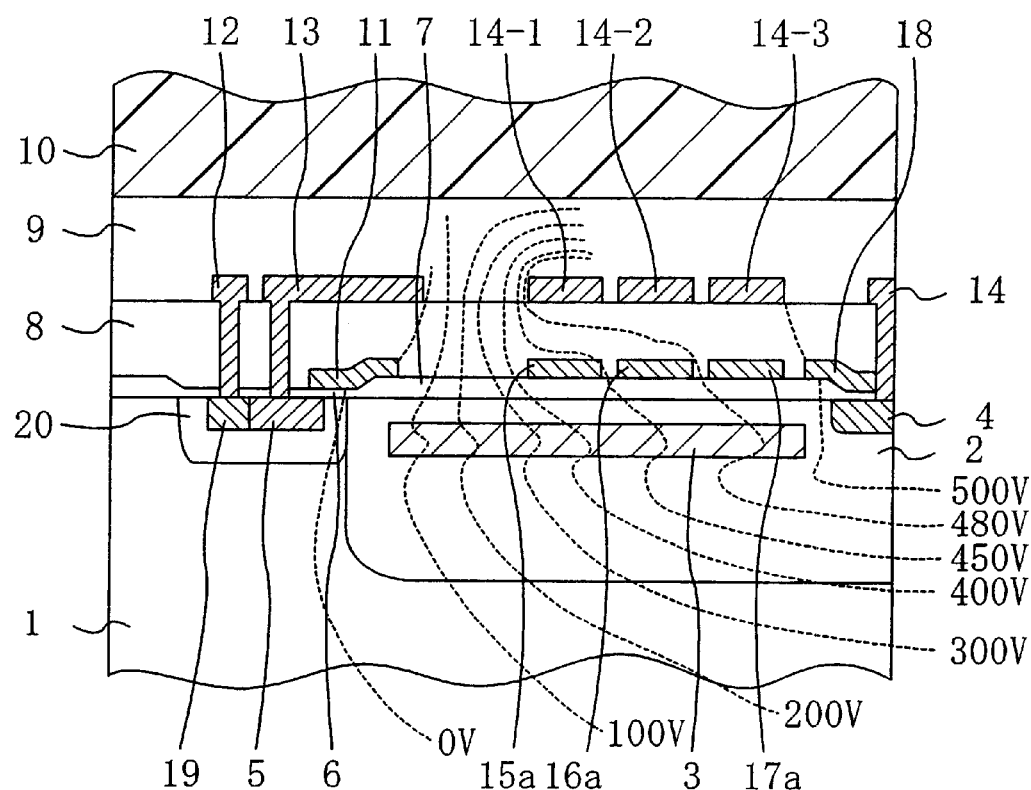
FIG. 4 is a cross-sectional view for illustrating the potential distribution during a high temperature bias test of the high breakdown voltage semiconductor device of Embodiment 1.

The potential distributions of FIGS. 3 and 4 are obtained based on the results of simulation performed by the inventors of the present invention. The conditions for this embodiment can be as follows: the impurity concentration of the p-type semiconductor substrate 1 is $2 \times 10^{14}$ cm$^{-3}$; the impurity surface concentration of the n-type drain offset diffusion region 2 is $1.5 \times 10^{16}$ cm$^{-3}$, and the diffusion depth is 7.5 $\mu$m; the impurity peak concentration of the p-type low concentration buried diffusion region 3 is $7.0 \times 10^{16}$ cm$^{-3}$, and the diffusion width in the depth direction is 1.0 $\mu$m; the impurity surface concentration of the drain diffusion region 4 and the source diffusion region 5 is $8.0 \times 10^{19}$ cm$^{-3}$, and the diffusion depth is 0.2 $\mu$m; the thickness of the thick oxide film 7 is 1 $\mu$m; the interlayer insulating film 8 is a CVD oxide film and the thickness thereof is 4 $\mu$m; the surface protective film 9 is a silicon nitride film and the thickness thereof is 1 $\mu$m; the plate electrodes 15a, 16a and 17a are formed of polysilicon or Al, the width thereof is 9 $\mu$m, and the interval between the electrodes is 1 $\mu$m; and the annular metal electrodes 14-1, 14-2 and 14-3 are formed of Al, the width thereof is 9 $\mu$m, and the interval between the electrodes is 1 $\mu$m.

FIG. 2 shows the surface protective film 9 and the resin 10 for sealing, which are omitted in the structure shown in FIG. 1. The surface protective film 9 of this embodiment is formed of, for example, silicate glass, silicon nitride, or a polyimide resin. The surface protective film 9 may be formed of a combination thereof or a laminated film. If the surface protective film 9 is constituted by a laminated film, it is preferable to form an insulating layer made of a polyimide resin as the upper layer. In this case, an insulating layer made of an inorganic material (e.g., silicate glass layer, silicon nitride layer) is formed as the lower layer. Examples of polyimide resin include polyamide imide resin, and polyamic acid resin (precursor of polyimide resin), in addition to polyimide. The resin 10 for sealing of this embodiment is formed of, for example, novolak epoxy resin or the like.

The polyimide resin retains high insulation properties even at high temperatures (150° C.), unlike novolak epoxy resin, so that it can be used for a reliable organic insulating film. Compared to an inorganic insulating film that is formed by CVD, the polyimide resin has an advantage in that its thickness can be easily controlled. For example, the thickness can be easily increased by increasing the viscosity of a precursor of the polyimide resin, or applying the precursor twice. Therefore, the surface protective film 9 is made of a polyimide resin layer or a multilayered film including a polyimide resin layer as the uppermost layer, the thickness of the surface protective film can be easily controlled. When the thickness of the surface protective film 9 is large, the capacitive coupling between the plate electrodes 15a, 16a, and 17a and the resin 10 for sealing can be small, so that the effect of preventing breakdown voltage degradation and increase of ON resistance can be enhanced.

In this embodiment, the annular metal electrodes 14-1, 14-2 and 14-3 electrically connected to the drain diffusion region 4 are capacitively coupled to the plate electrodes 15a, 16a and 17a, respectively, which are in the electrically floating state. For this reason, a parasitic capacitance Ca1 is present between the plate electrode 15a and the drain offset diffusion region 2, a parasitic capacitance Ca2 is present between the plate electrode 16a and the drain offset diffusion region 2, and a parasitic capacitance Ca3 is present between the plate electrode 17a and the drain offset diffusion region 2. Furthermore, a parasitic capacitance Cb1 is present between the plate electrode 15a and the metal electrode 14-1, a parasitic capacitance Cb2 is present between the plate electrode 16a and the metal electrode 14-2, and a parasitic capacitance Cb3 is present between the plate electrode 17a and the metal electrode 14-3.

A parasitic capacitance Cc1 is present between the metal electrode 14-1 and the resin 10 for sealing, a parasitic capacitance Cc2 is present between the metal electrode 14-2 and the resin 10 for sealing, and a parasitic capacitance Cc3 is present between the metal electrode 14-3 and the resin 10 for sealing. It should be noted that since a voltage (500 V) applied to the metal electrode 14 for a drain is applied to the metal electrodes 14-1, 14-2 and 14-3, the parasitic capacitances Cc1, Cc2, and Cc3 do not affect the potentials of the plate electrodes 15a, 16a and 17a. Therefore, when the potentials of the plate electrodes 15a, 16a and 17a are examined, it is sufficient to consider only the effects of the parasitic capacitances Ca1, Ca2, and Ca3, Cb1, Cb2, and Cb3.

When the voltage applied to the metal electrode 14 for a drain is 500 V, the potential of the plate electrode 15a is a voltage obtained by dividing the potential difference between the potential in a portion of the drain offset diffusion region 2 immediately below the plate electrode 15a and the drain voltage of 500 V by the series circuits of Ca1 and Cb1. Similarly, the potential of the plate electrode 16a is a voltage obtained by dividing the potential difference between the potential in a portion of the drain offset diffusion region 2 immediately below the plate electrode 16a and the drain voltage of 500 V by the series circuits of Ca2 and Cb2. Furthermore, the potential of the plate electrode 17a is a voltage obtained by dividing the potential difference between the potential in a portion of the drain offset diffusion region 2 immediately below the plate electrode 17a and the drain voltage of 500 V by the series circuits of Ca3 and Cb3.

The inventors of the present invention estimated the potentials of the plate electrodes 15a, 16a, and 17a, assuming that each of the capacitance ratio of Ca1 to Cb1, the capacitance ratio of Ca2 to Cb2, and the capacitance ratio of Ca3 to Cb3 is 4 to 1. The results will be described with reference to FIG. 3. FIG. 3 is a conceptual view showing the potential distribution when 500 V is applied to the metal electrode 14 for a drain, and in FIG. 3, the broken lines indicate the equipotential lines of 0 V, 100 V, 200 V, 300 V, 400 V, 450 V, 480 V, and 500 V.

In this case, the potential of a portion of the drain offset diffusion region 2 immediately below the plate electrode 17a, which is the nearest to the drain diffusion region 4, is slightly lower than the drain voltage, which is about 490 V. Furthermore, the potential of a portion of the drain offset diffusion region 2 immediately below the plate electrode 16a, which is nearer to the source diffusion region 5, is about 470 V. The potential of a portion of the drain offset diffusion region 2 immediately below the plate electrode 15a, which is the nearest to the source diffusion region 5, is about 440 V.

Based on these potentials, the potential of the plate electrode 15a is estimated to be about 450 V, because this potential is equal to a potential obtained by dividing the potential difference between the potential (about 440 V) of the portion of the drain offset diffusion region 2 immediately below the plate electrode 15a and the voltage 500 V of the metal electrode 14-1 by the series circuits of Ca1 and Cb1. Similarly, the potential of the plate electrode 16a is estimated to be about 475 V, because this potential is equal to a potential obtained by dividing the potential difference between the potential (about 470 V) of the portion of the drain offset diffusion region 2 immediately below the plate electrode 16a and the voltage 500 V of the metal electrode 14-2 by the series circuits of Ca2 and Cb2. Furthermore, the potential of the plate electrode 17a is estimated to be a potential several volts higher than the potential (about 490 V) of the drain offset diffusion region 2, because this potential is equal to a potential obtained by dividing the potential difference between the potential (about 490 V) of the portion of the drain offset diffusion region 2 immediately below the plate electrode 17a and the potential (500 V) of the metal electrode 14-3 by the series circuits of Ca3 and Cb3.

Therefore, in a portion where the metal electrodes 14-1, 14-2, and 14-3 and 15a, 16a and 17a are arranged and the vicinity thereof, the equipotential lines crossing the interface between the oxide film 7 and the drain offset diffusion region 2 are inclined to the source side. As a result, the potential on the oxide film 7 side is positive with respect to the surface of the drain offset diffusion region 2.

Next, FIG. 4 shows the potential distribution in the course of performing a high temperature bias reliability test under the same bias conditions as those in the case of FIG. 3. In FIG. 4, it is assumed that the potential at the interface between the surface protective film 9 and the resin 10 for sealing is 100 V.

In this case, since the voltage of 500 V of the drain electrode 14 is applied to the metal electrodes 14-1, 14-2, and 14-3, the portion where the metal electrodes 14-1, 14-2, and 14-3 and the plate electrodes 15a, 16a and 17a are arranged is not affected by the potential of 100 V at the interface between the surface protective film 9 and the resin 10 for sealing, and the inclination of the equipotential lines crossing the interface between the oxide film 7 and the drain offset diffusion region 2 is maintained. As a result, no slow trap occurs.

Since the polysilicon gate electrode 11 has a field plate effect, the equipotential lines in the vicinity of the polysilicon gate electrode 11 are inclined to the drain side. As a result, at the interface between the oxide film 7 and the drain offset diffusion region 2 in this portion, the potential is negative on the side of the oxide film 7. Therefore, in this portion, positive fixed charges and negative movable charges are generated because of a slow trap, and the negative movable charges move through the oxide film 7 to the drain side. However, since the equipotential lines are inclined to the source side in the portion where the metal electrodes 14-1, 14-2, and 14-3, and the plate electrodes 15a, 16a and 17a are arranged, the negative movable charges are distributed in the vicinity of the interface between the oxide film 7 and the plate electrodes 15a, 16a and 17a, not in the vicinity of the interface between the oxide film 7 and the drain offset diffusion region 2. Therefore, the p-type inversion layer on the surface of the drain offset diffusion region 2 is prevented from being generated and the ON resistance from increasing during the high temperature bias test.

In this embodiment, the metal electrode 14 for a drain is extended to portions (14-1, 14-2, 14-3) on the interlayer insulating film 8 positioned immediately above the plurality of plate electrodes 15a, 16a and 17a, respectively, and the plurality of plate electrodes 15a, 16a and 17a are capacitively coupled to the metal electrodes 14-1, 14-2, and 14-3. Therefore, the voltages divided by the series circuits of the parasitic capacitances (Cb1, Cb2, and Cb3) between the plate electrodes 15a, 16a and 17a and the metal electrodes 14-1, 14-2, and 14-3 immediately thereabove and the parasitic capacitances (Ca1, Ca2, and Ca3) between the plate electrodes 15a, 16a and 17a and the semiconductor region 2 immediately therebelow determine the potentials of the plate electrodes 15a, 16a and 17a, so that they are substantially not affected by the surface protective film 9 and the layers thereabove. In the structure of this embodiment, a higher voltage can be supplied stably to the plate electrodes 15a, 16a and 17a in the floating state than the drain offset diffusion region 2, and therefore no positive fixed charges nor negative movable charges are generated at the interface between the semiconductor region 2 and the oxide film 7. As a result, a highly reliable high breakdown voltage semiconductor device in which the ON resistance is not changed during a high temperature bias reliability test can be realized.

In this embodiment, the number of the plate electrodes (15a, 16a and 17a) in the floating state is three, but the number of the plate electrodes is not limited to three, and at least one can suppress changes in the ON resistance to improve the reliability. On the other hand, a large number of plate electrodes can be provided.

Figure 5:
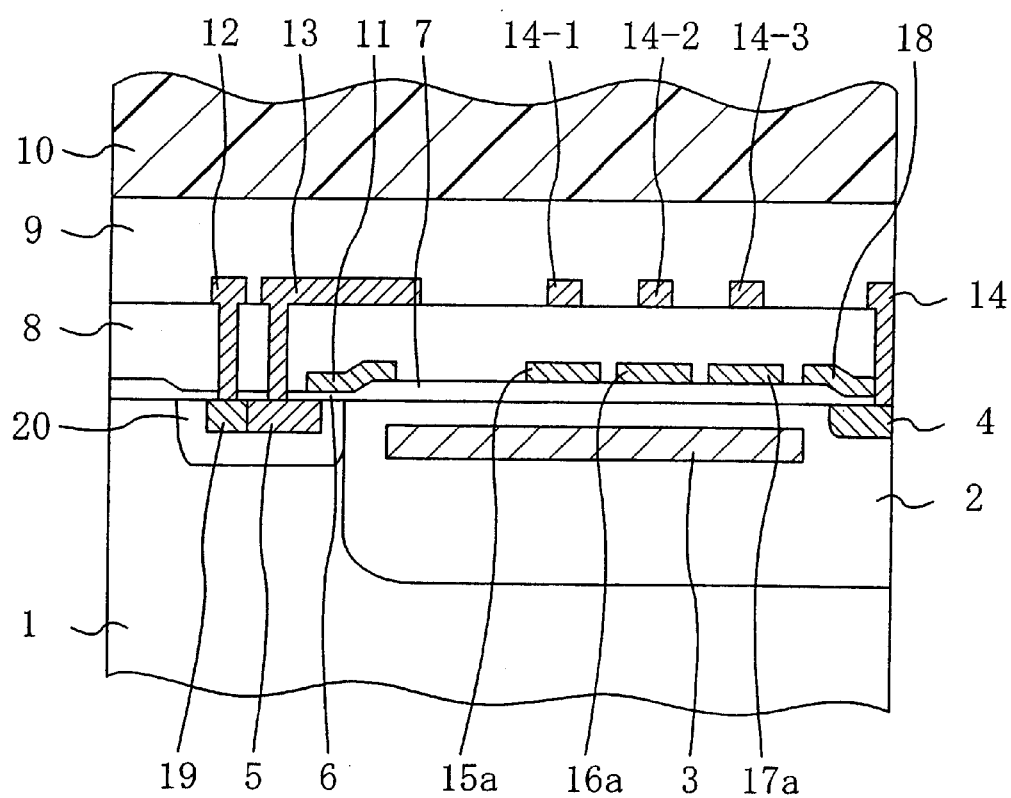
FIG. 5 is a cross-sectional view showing a variation of the high breakdown voltage semiconductor device of Embodiment 1.

As shown in FIG. 5, the width of the metal electrodes 14-1, 14-2, and 14-3 can be smaller than that of the plate electrodes 15a, 16a and 17a. By changing the width of the metal electrodes (14-1, 14-2, and 14-3), the value of the parasitic capacitances (Cb1, Cb2, and Cb3 in FIG. 2) can be changed as appropriate, so that the potentials of the plate electrodes 15a, 16a and 17a can be set to desired potentials. Therefore, it is possible to set desired potentials for the plate electrodes (15a, 16a and 17a) in a simple manner by changing the width of the metal electrodes (14-1, 14-2, and 14-3) depending on the voltage applied to the metal electrode 14 for a drain.

In the case of the structure shown in FIG. 5, there are some portions of the plate electrodes 15a, 16a and 17a that are not covered with the metal electrodes 14-1, 14-2, and 14-3 in the normal direction of the substrate, so that this structure is more likely to be affected by the effect of the potential at the interface between the surface protective film 9 and the resin 10 for sealing than the structure shown in FIG. 1. However, it is possible to keep the potentials of the plate electrodes 15a, 16a and 17a at potentials higher than those on the corresponding surface of the drain offset diffusion region 2 positioned immediately below the respective plate electrodes. Therefore, in the structure as shown in FIG. 5 as well as the structure shown in FIG. 1, a highly reliable high breakdown voltage semiconductor device in which the ON resistance is not changed during a high temperature bias reliability test can be realized.

Figure 6:
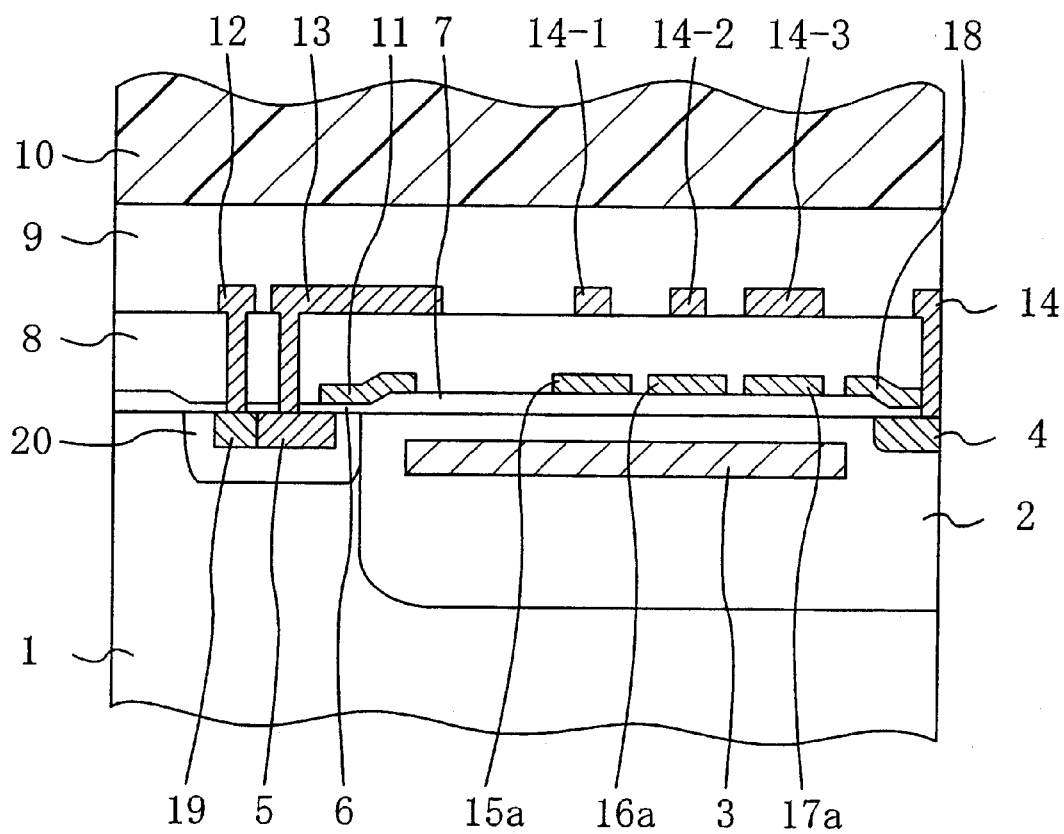
FIG. 6 is a cross-sectional view showing a variation of the high breakdown voltage semiconductor device of Embodiment 1.

As shown in FIG. 6, which is a variation of the structure shown in FIG. 5, the width of the metal electrode 14-3 positioned nearest to the drain may be the same as that of the plate electrode 17a. This structure allows the plate electrode 17a to be less affected by the potential at the interface between the surface protective film 9 and the resin 10 for sealing than in the structure shown in FIG. 5.

Figure 7:
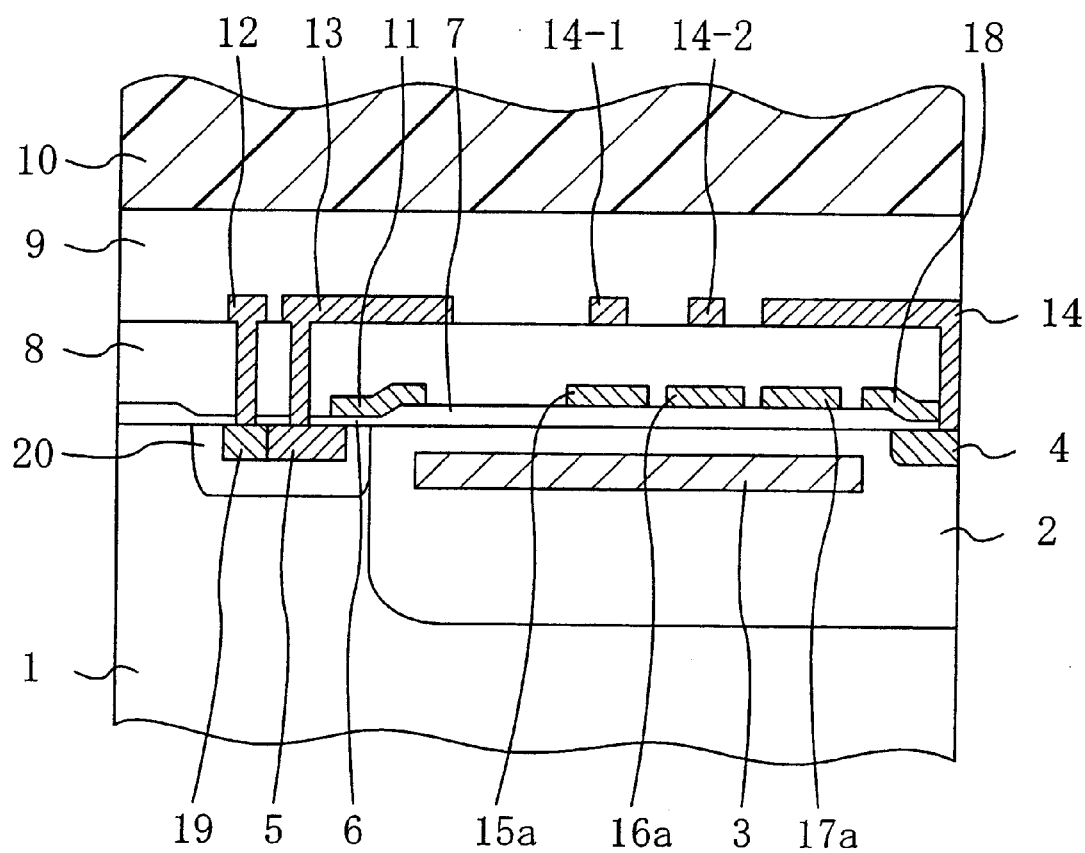
FIG. 7 is a cross-sectional view showing a variation of the high breakdown voltage semiconductor device of Embodiment 1.

Furthermore, as shown in FIG. 7, the metal electrode 14-3 and the upper end of the metal electrode 14 for a drain are integrally formed so that the plate electrode 17a is covered entirely with the metal electrode 14 for a drain. In other words, when viewed from the normal direction of the substrate, the structure may be such that the upper end of the metal electrode 14 for a drain is extended so as to cover the entire region up to the outer edge of the annular metal electrode 14-3 with the drain diffusion region 4 as the center.

With this structure, even if defects occur in the surface protective film 9, which is a layer over the metal electrode 14 for a drain, and the insulation becomes poor, the effect of the poor insulation is interrupted by the metal electrode 14, because a drain voltage is applied to the metal electrode 14 for a drain. As a result, the plate electrode 17a, which is positioned below the metal electrode 14, or the drain offset diffusion region 2 immediately therebelow are not adversely affected.

In addition, in the structure shown in FIG. 7, the parasitic capacitance (Cb3 in FIG. 2) between the plate electrode 17a and the metal electrode 14 for a drain is larger, the potential of the plate electrode 17a is higher than that in the above-described structure. However, also in the structure shown in FIG. 7, the potential (positive potential) on the oxide film 7 side is higher than that on the surface of the drain offset diffusion region 2 immediately below the plate electrode 17a, so that no p-type insertion layer is generated on the surface of the drain offset diffusion region 2. As a result, the ON resistance is not increased, even if a high temperature bias test is performed.

As described above, according to this embodiment, a capacitance series circuit is configured by the presence of the parasitic capacitances between the plate electrodes and the metal electrodes thereabove, and the parasitic capacitances between the plate electrodes and the drain offset diffusion region immediately below the plate electrodes, and the potential of a portion of the drain offset diffusion immediately below the plate electrodes and the drain voltage are divided by the capacitance series circuit, so that an appropriate bias voltage can be supplied to the plate electrodes that are in the floating state. Thus, even in a reliability test such as a high temperature bias test, a p-type inversion layer is prevented from being generated on the surface of the drain offset diffusion region, and the ON resistance is not increased over time, which provides high reliability. In the case of the structure in which the plate electrodes are covered with an annular metal electrode to which a drain voltage is applied, even if poor insulation is caused in the surface protective film in which defects are likely to occur due to a stress, a stable potential can be applied to the drain offset diffusion region therebelow, and not only temporal change in the ON resistance during a high temperature bias test, but also poor breakdown voltage properties due to the poor insulation of the surface protective film can be prevented.

Embodiment 2

Figure 8:
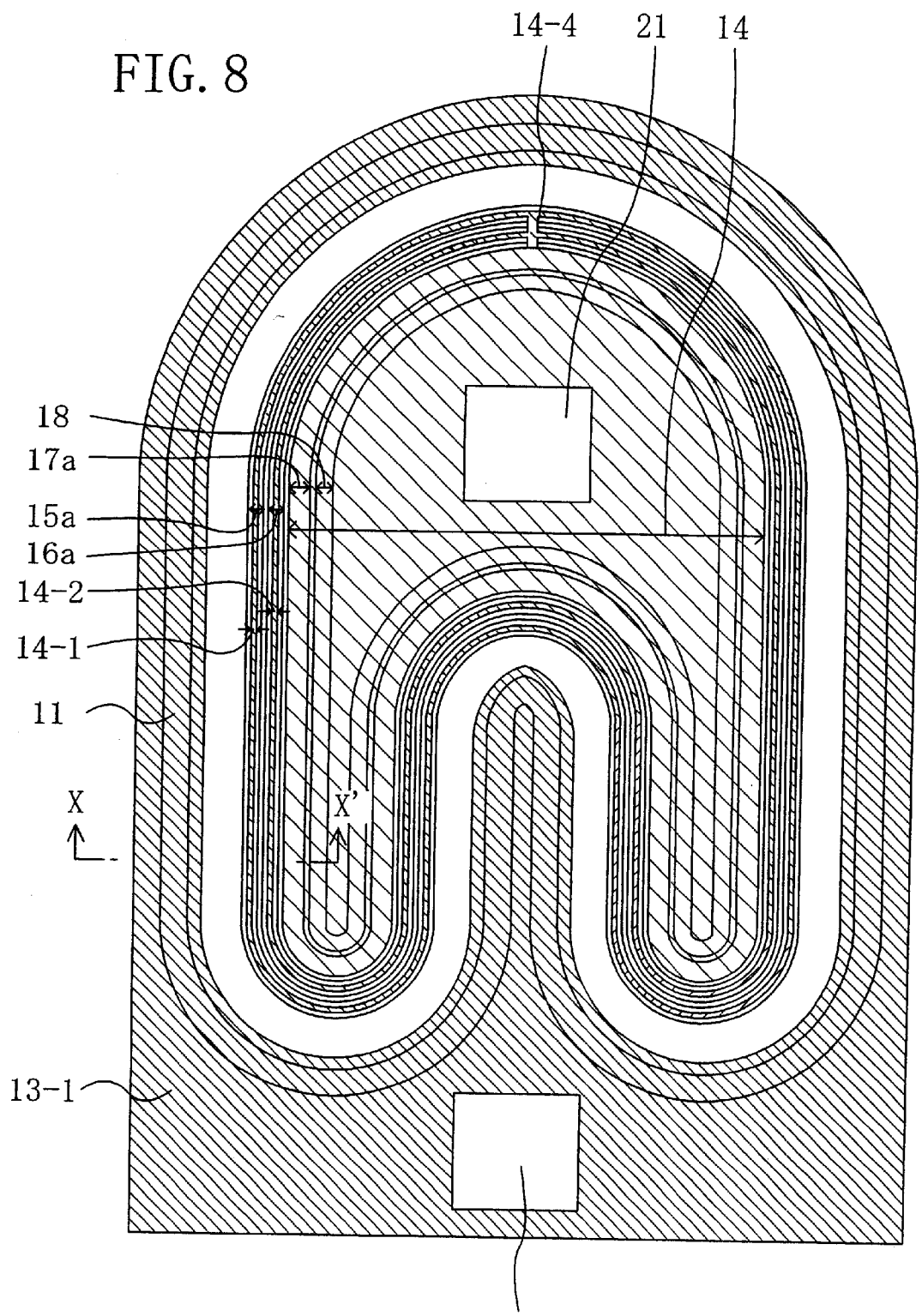
FIG. 8 is a plan view of a high breakdown voltage semiconductor device of Embodiment 2 of the present invention.

A high breakdown voltage semiconductor device of Embodiment 2 of the present invention will be described with reference to FIG. 8. FIG. 8 is a plan view of a high breakdown voltage semiconductor device of this embodiment. For easy understanding of the drawing, FIG. 8 shows only the metal electrodes and the plate electrodes.

FIG. 8 shows a plan structure of the high breakdown voltage semiconductor device having the structure shown in FIG. 7 when it is used with large current, and the cross-sectional structure (cross-sectional structure between the source and the drain) taken along line X–X' in FIG. 8 is the same as the cross-sectional structure shown in FIG. 7 except that the source metal electrode 13 and the body metal electrode 12 are connected to each other so as to form a source and body common metal electrode 13-1. For simplification of description, in this embodiment, different aspects from those in Embodiment 1 will be mainly described, and description of the same aspects as in Embodiment 1 will be omitted or simplified.

In this embodiment, a bonding pad 21 for a drain metal electrode is disposed in the drain metal electrode 14. Furthermore, a bonding pad 22 for a source and body metal electrode is disposed in the source and body common metal electrode 13-1. The bonding pad 21 or 22 can be formed by removing the surface protective film 9 on the drain metal electrodes 14 or the source and body common metal electrode 13-1 in the portions corresponding to the pad portions to expose the metal electrode 14 or 13-1.

In the structure shown in FIG. 8, the drain and the source form an interdigital shape in order to make the gate width per unit area large. In this embodiment, the drain and the source form an interdigital shape with two fingers, but the drain and the source can form an interdigital shape with three or more fingers (comb-like shape).

In the high breakdown voltage semiconductor device of this embodiment, the gate width per unit area can be large by forming an interdigital shape (or comb-like shape) for the drain and the source shape. Therefore, it can be used with a large current of several hundreds of mA to several tens of A, and the ON resistance is not increased in a high temperature bias test, and thus a power transistor can be realized.

Embodiment 3

Figure 9:
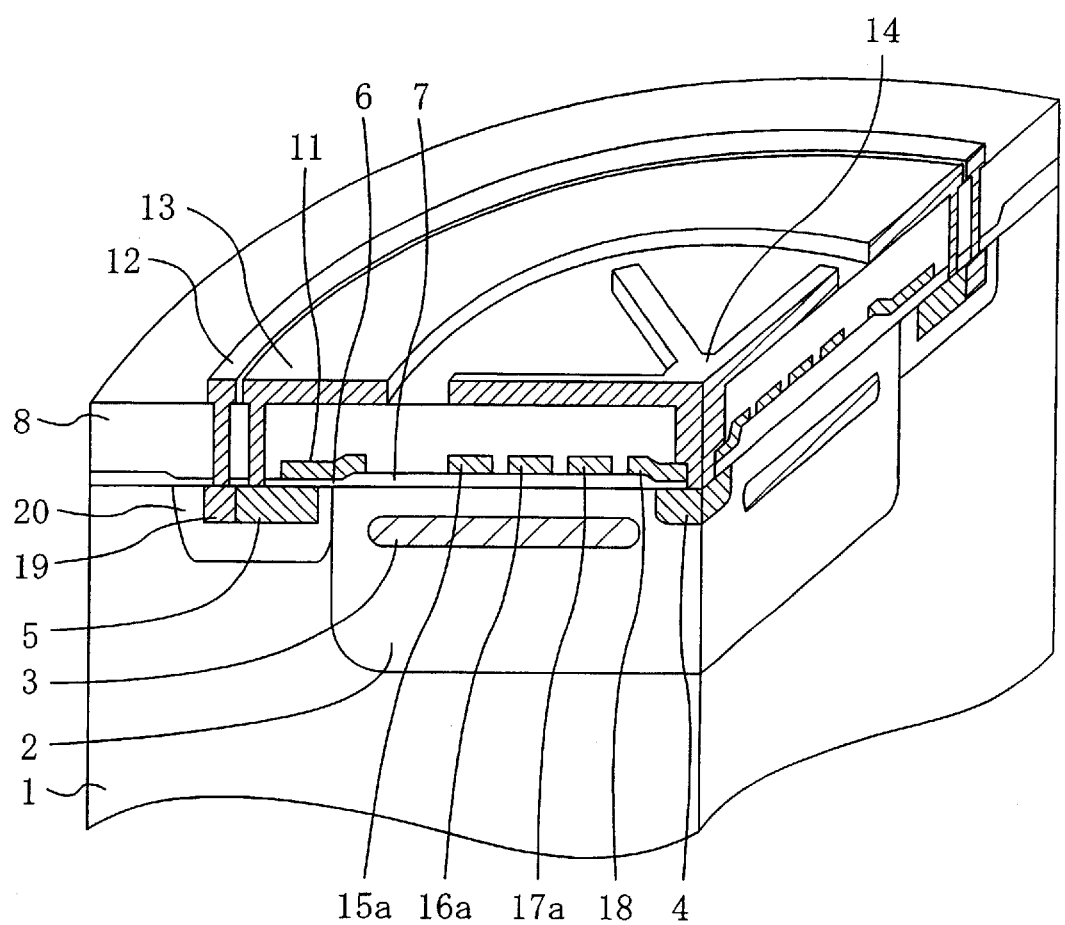
FIG. 9 is a cross-sectional perspective view of a high breakdown voltage semiconductor device of Embodiment 3 of the present invention.
Figure 10:
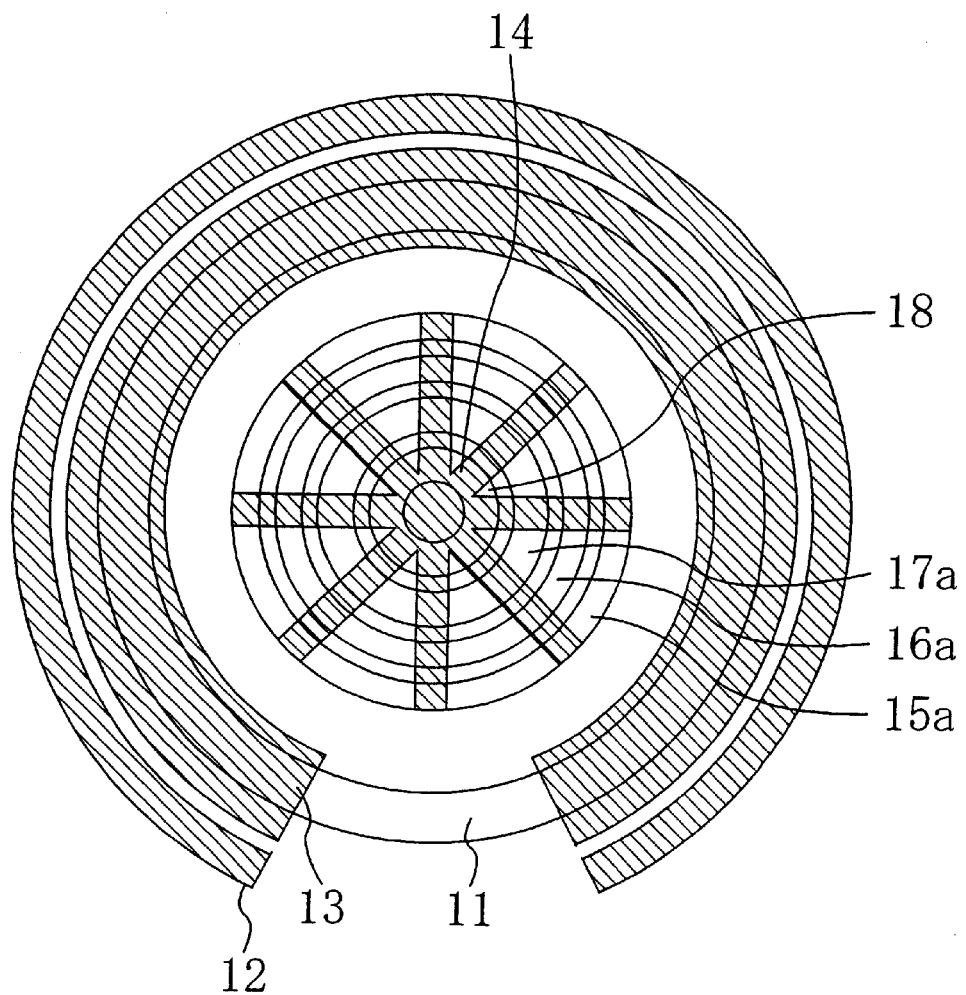
FIG. 10 is a plan view of the high breakdown voltage semiconductor device of Embodiment 3 of the present invention.

A high breakdown voltage semiconductor device of Embodiment 3 of the present invention will be described with reference to FIGS. 9 and 10. FIG. 9 is a cross-sectional perspective view of a high breakdown voltage semiconductor device of this embodiment, and FIG. 10 is a plan view thereof The high breakdown voltage semiconductor device of this embodiment is different from Embodiments 1 and 2 in that the metal electrode 14 is extended such that a part of the metal electrode 14 crosses the plate electrodes 15a, 16a and 17a. That is to say, in this embodiment, the metal electrode 14 extended onto the plate electrodes 15a, 16a and 17a is formed not annularly (14-1, 14-2 and 14-3) but radially. Other aspects are the same as in the structure of Embodiment 1, so that for simplification of description, description of the same aspects will be omitted or simplified.

In the structure of this embodiment, the parasitic capacitances Cb1, Cb2 and Cb3 between the drain metal electrode 14 and the plate electrodes 15a, 16a and 17a depend on the area ratio of the region in which the drain metal electrode 14 crosses the plate electrodes 15a, 16a and 17a. Therefore, the number of the crossings of the drain metal electrode 14 and the plate electrodes 15a, 16a and 17a and the width of the crossing drain metal electrode are set as appropriate, so that the parasitic capacitances Cb1, Cb2 and Cb3 can be designed as desired.

In other words, in the structure shown in FIG. 5 or 6, there is a limit on increasing the capacitance ratio of the parasitic capacitances Cb1 and Ca1 because of the restrictions by the smallest pattern width that can be produced in the metal electrode formation process, even if the parasitic capacitance Cb1 or Ca1 is desired to be minimized by narrowing the width of the annular metal electrode 14-1 or 14-2. On the other hand, according to the structure of this embodiment, even if the width of the drain metal electrode 14 is minimized to the limit restricted by the formation process, a smaller parasitic capacitance Cb1 than that in the structure shown in FIG. 5 or 6 can be realized by reducing the number of the crossings of the drain metal electrode 14 and the plate electrodes 15a, 16a and 17a. Therefore, the capacitance ratio of the parasitic capacitances Cb1 and Ca1 is increased so that the potential of the plate electrode 15a can be close to the potential on the surface of the drain offset diffusion region 2, so that the electric field between the gate electrode 11 and the plate electrode 15a can be alleviated. Thus, a higher initial breakdown voltage can be ensured.

Figure 11:
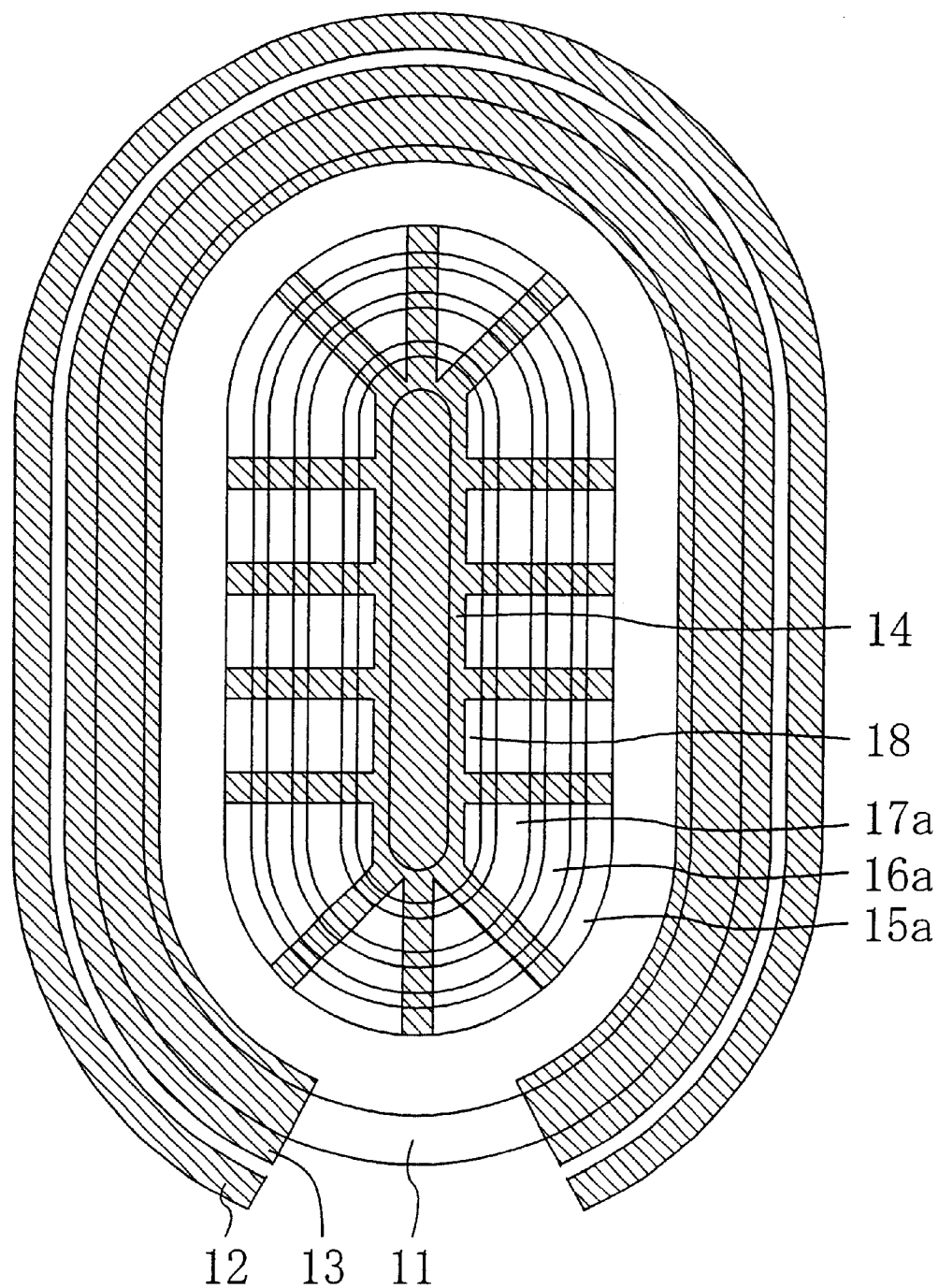
FIG. 11 is a plan view of a variation of the high breakdown voltage semiconductor device of Embodiment 3 of the present invention.
Figure 12:
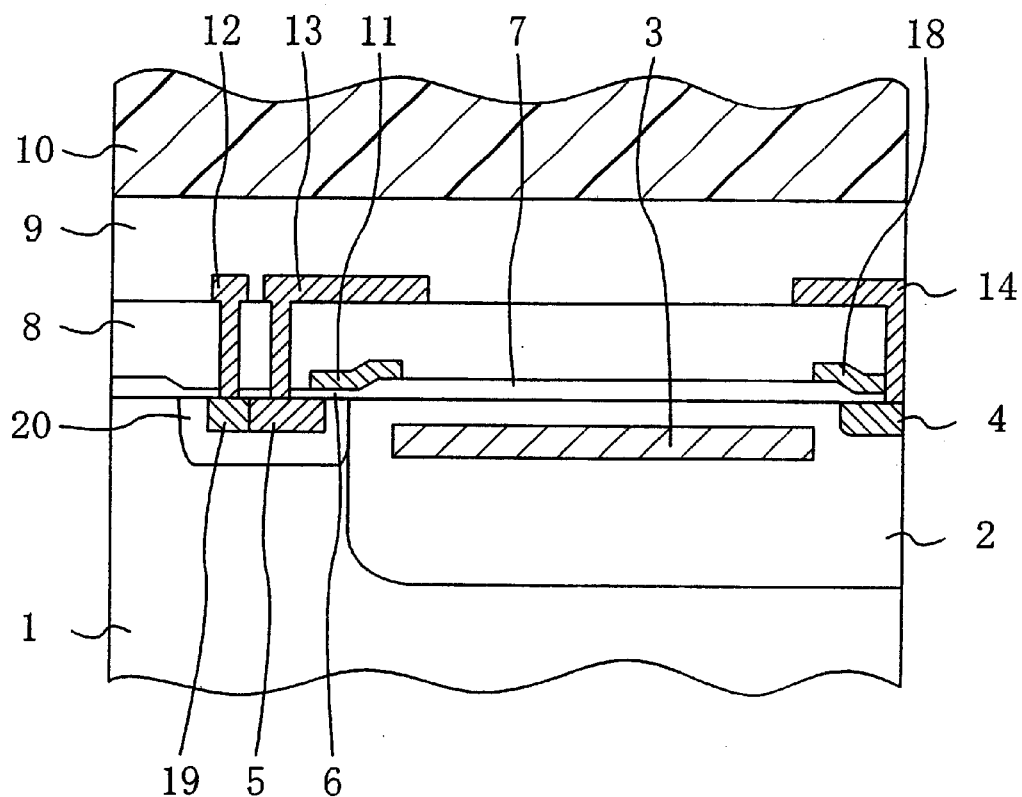
FIG. 12 is a cross-sectional view showing a conventional high breakdown voltage semiconductor device.
Figure 13:
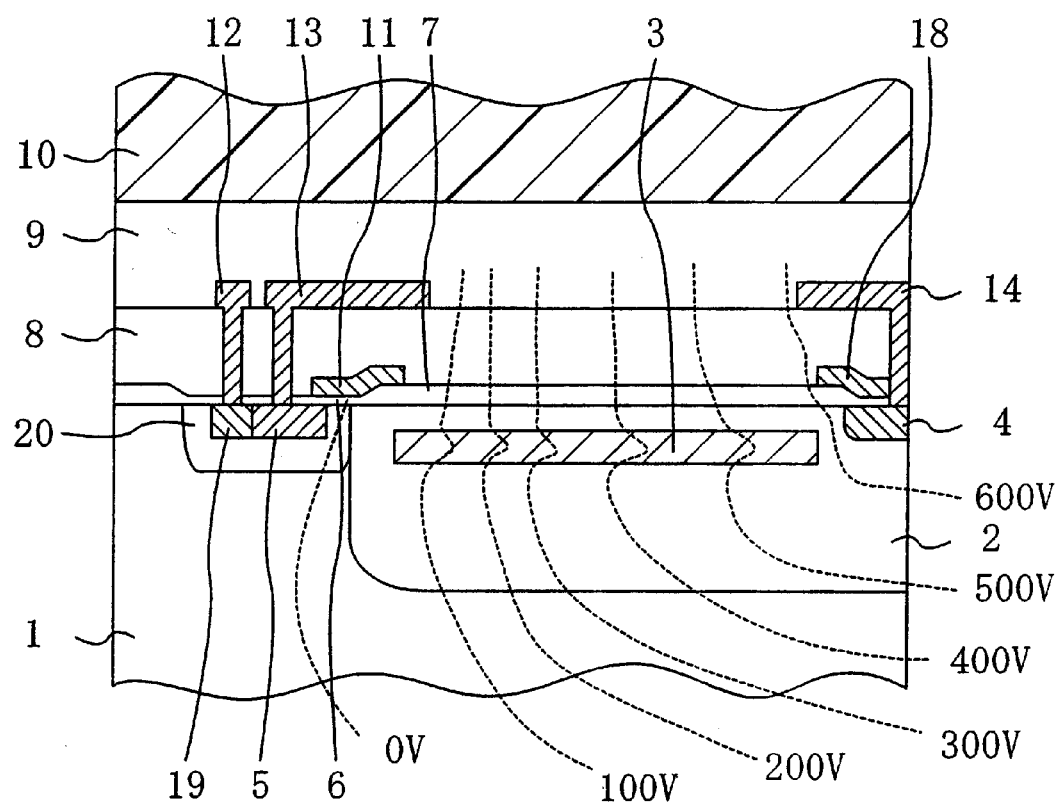
FIG. 13 is a cross-sectional view for illustrating the potential distribution at room temperature of the conventional high breakdown voltage semiconductor device.
Figure 14:
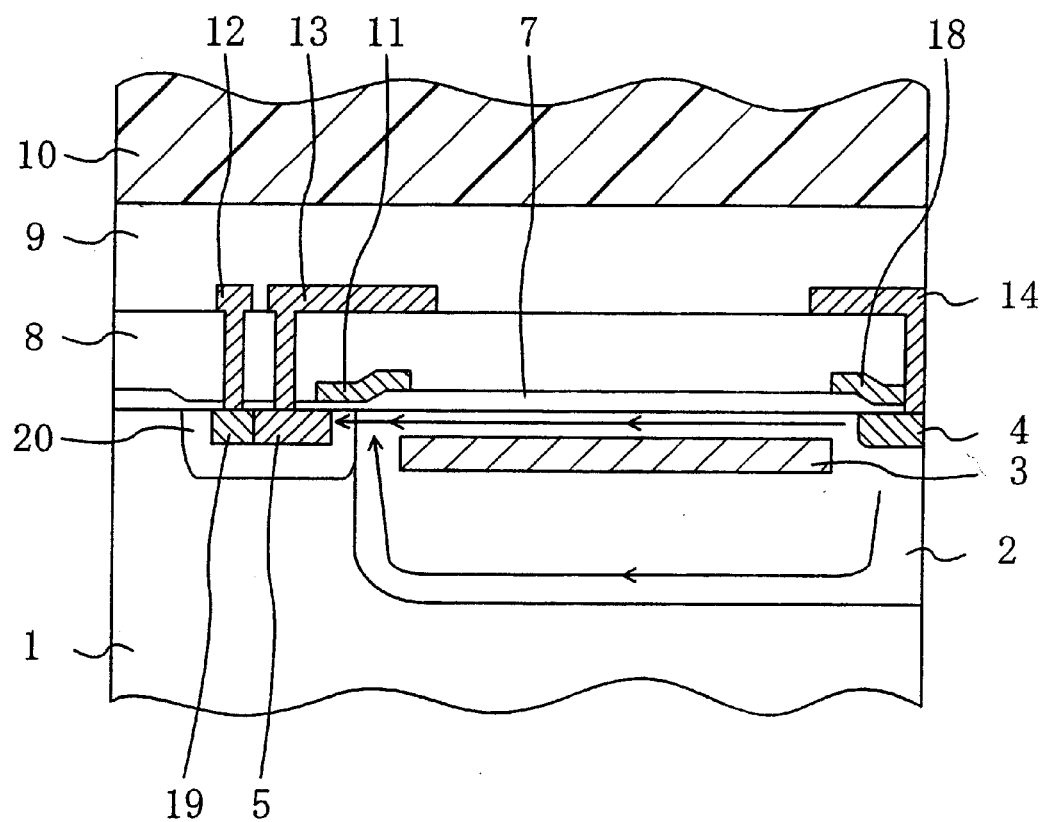
FIG. 14 is a cross-sectional view for illustrating the current path of the conventional high breakdown voltage semiconductor device.

In this embodiment, the plan shape is circular, as shown in FIG. 10, but the shape is not limited thereto, and the plan shape can be an elongated shape (e.g., a track shape), as shown in FIG. 11. In the straight portion of the drain region, the drain metal electrode 14 is extended with a narrow shape so as to cross the plate electrodes 15a, 16a and 17a, as in the circular portion.

In this embodiment, the metal electrode 14 is extended so as to cross all of the plate electrodes 15a, 16a and 17a, but the plurality of narrow extended metal electrodes 14 do not necessarily cross all the plate electrodes 15a, 16a and 17a, and each of them can be a desired width, length and shape so that a desired parasitic capacitance with respect to the plate electrodes can be obtained.

Other embodiments

In the above-described embodiments, the structure in which the plate electrode and the metal electrode are not disposed between the gate electrode 11 and the plate electrode 15a has been described. However, the plate electrode and the metal electrode can be disposed between the gate electrode 11 and the plate electrode 15a. In this case, since the electric field between the gate electrode 11 and the adjacent plate electrode increases, the breakdown voltage drops, but they can be used in view of the desired breakdown voltage level.

Furthermore, the structure in which one low concentration buried diffusion region 3 is formed in the drain offset diffusion region 2 has been described, but the structure in which a plurality of low concentration buried diffusion regions 3 are formed in the drain offset diffusion region 2 can also provide a highly reliable high breakdown voltage semiconductor device in which the ON resistance is not changed during a high temperature bias reliability test.

Furthermore, an n-type impurity diffusion region (not shown) may be added separately and formed in an upper portion (especially, above the low concentration buried diffusion region 3) in the drain offset diffusion region 2. In this case, it is advantageous to form the n-type impurity diffusion region to be added so as to have an impurity concentration equal to that of the drain offset diffusion region 2 or one digit higher than that, because the ON resistance can be small, the breakdown voltage is only slightly reduced, and the variation in the breakdown voltage and the variation in the ON resistance can be small.

In the above-described embodiments, a p-type semiconductor substrate 1 is used as the semiconductor region for a body of an insulated gate transistor, but a p-type well region formed on an n-type semiconductor substrate can be used as the semiconductor region for a body, or a p-type region formed in an island shape above a semiconductor substrate (or SOI substrate) and insulated and isolated from the semiconductor substrate by an insulating film thereon can be used as the semiconductor region for a body. When a substrate on which an insulating layer is formed at least on its surface (SOI substrate) is used, the semiconductor region for a body (semiconductor layer of the first conductivity type) 1 is provided on the insulating layer formed on, for example, a silicon substrate.

Furthermore, an n-type well region and a p-type well region are formed on a p-type or n-type semiconductor substrate, and the n-type well region is used as the semiconductor region for a body of an insulated gate transistor for a p-channel, and the p-type well region is used as the semiconductor region for a body for an n-channel, so that insulated gate transistors having different poles can be integrated on the same semiconductor substrate. In addition, using known pn junction isolation techniques or dielectric isolation techniques, a plurality of semiconductor regions for a body can be formed on one semiconductor substrate, and the drain diffusion region 4 is not necessarily formed in the center of a semiconductor substrate.

In the above-described embodiments, the diffusion region 20 for preventing a punch-through is provided to increase locally the impurity concentration of the semiconductor substrate 1 immediately below the gate electrode 11 so that the punch-through phenomenon hardly occurs between the source diffusion region 5 and the drain offset diffusion region 2. The diffusion region 20 for punch-through prevention is necessary only when a desired breakdown voltage level requires it, and it is not always necessary.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A high breakdown voltage semiconductor device comprising:

a semiconductor layer of a first conductivity type;

a drain offset diffusion region of a second conductivity type formed in the semiconductor layer of the first conductivity type;

a source diffusion region of the second conductivity type formed in the semiconductor layer of the first conductivity type apart from the drain offset diffusion region;

a drain diffusion region of the second conductivity type formed in the drain offset diffusion region;

a buried diffusion region of the first conductivity type that is buried in the drain offset diffusion region and at least a part of which is electrically connected to the semiconductor layer of the first conductivity type;

a gate insulating film formed on a portion of the semiconductor layer of the first conductivity type that is positioned between the source diffusion region and the drain offset diffusion region;

a gate electrode formed on the gate insulating film;

a field insulating film formed on the drain offset diffusion region;

at least one plate electrode in a floating state formed on the field insulating film;

an interlayer insulating film formed on the field insulating film and the at least one plate electrode; and a metal electrode that is formed on the interlayer insulating film positioned on the at least one plate electrode and a part of which is electrically connected to the drain diffusion region and that is capacitively coupled to the at least one plate electrode.

2. The high breakdown semiconductor device according to claim 1, wherein the drain diffusion region is formed in the central portion of the drain offset diffusion region, and has a substantially circular shape when viewed from a normal direction of the semiconductor layer, the source diffusion region is formed in the semiconductor layer with a predetermined distance from an outer circumference of the drain offset diffusion region so as to surround the outer circumference thereof, and the buried diffusion region is buried in the drain offset diffusion region so as to surround the substantially circular outer circumference of the drain diffusion region.

3. The high breakdown semiconductor device according to claim 2, wherein the at least one plate electrode is a plurality of annular electrodes that are formed concentrically around the drain diffusion region as its center.

4. The high breakdown semiconductor device according to claim 3, wherein the metal electrode comprises a plurality of annular metal electrodes positioned on the plurality of annular electrodes via the interlayer insulating film, and a joining portion electrically connecting the plurality of annular metal electrodes to each other, and each of the plurality of annular electrodes is capacitively coupled to the corresponding one of the plurality of annular metal electrodes via the interlayer insulating film.

5. The high breakdown semiconductor device according to claim 3, wherein when viewed from the normal direction of the substrate layer, the metal electrode has a portion covering an entire region up to an outer edge of the annular electrode that is positioned nearest to the drain diffusion region of the plurality of annular electrodes with the drain diffusion region as its center.

6. The high breakdown semiconductor device according to claim 1, wherein a width of the metal electrode positioned above the at least one plate electrode is smaller than that of the at least one plate electrode.

7. The high breakdown semiconductor device according to claim 1, wherein when viewed from the normal direction of the substrate layer, the metal electrode has a portion extended on the interlayer insulating film so as to cross a part of the at least one plate electrode.

8. The high breakdown semiconductor device according to claim 1, further comprising a surface protective film formed on the metal electrode and the interlayer insulating film, and a sealing resin portion formed on the surface protective film.

9. The high breakdown semiconductor device according to claim 8, wherein the surface protective film is a multi-layered film including an upper layer made of a polyimide resin and an insulating layer made of an inorganic material as a lower layer.

10. The high breakdown semiconductor device according to claim 2, further comprising a surface protective film formed on the metal electrode and the interlayer insulating film, and a sealing resin portion formed on the surface protective film.

11. The high breakdown semiconductor device according to claim 10, wherein the surface protective film is a multi-layered film including an upper layer made of a polyimide resin and an insulating layer made of an inorganic material as a lower layer.

12. The high breakdown semiconductor device according to claim 1, wherein the semiconductor layer is a semiconductor substrate.

13. The high breakdown semiconductor device according to claim 1, wherein the semiconductor layer of the first conductivity type is formed on a substrate on which an insulating layer is formed at least on its surface.

* * * * *